(12) United States Patent
Brebner et al.

(10) Patent No.: US 7,784,014 B1
(45) Date of Patent: Aug. 24, 2010

(54) GENERATION OF A SPECIFICATION OF A NETWORK PACKET PROCESSOR

(75) Inventors: Gordon J. Brebner, Los Gatos, CA (US); Christopher E. Neely, San Jose, CA (US); Philip B. James-Roxby, Longmont, CO (US); Eric R. Keller, Boulder, CO (US); Chidamber R. Kulkarni, Santa Clara, CA (US); Michael A. Baxter, Sunnyvale, CA (US); Henry E. Styles, San Jose, CA (US); Graham F. Schelle, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 775 days.

(21) Appl. No.: 11/799,897

(22) Filed: May 3, 2007

(51) Int. Cl.
*G06F 17/50* (2006.01)

(52) U.S. Cl. .......................... 716/18; 716/17

(58) Field of Classification Search .................. None
See application file for complete search history.

(56) References Cited

U.S. PATENT DOCUMENTS

| | | | |
|---|---|---|---|
| 5,500,796 A | 3/1996 | Black, Jr. | |
| 6,477,683 B1 | 11/2002 | Killian et al. | |
| 6,665,725 B1 | 12/2003 | Dietz et al. | |
| 6,687,247 B1 | 2/2004 | Wilford et al. | |
| 6,771,646 B1 | 8/2004 | Sarkissian et al. | |
| 6,794,896 B1 | 9/2004 | Brebner | |
| 7,047,303 B2 | 5/2006 | Lingafelt et al. | |
| 7,398,502 B1 | 7/2008 | Kulkarni et al. | |
| 7,552,042 B1 | 6/2009 | Brebner et al. | |
| 7,636,908 B1 * | 12/2009 | Brebner ..................... | 716/18 |
| 7,669,166 B1 * | 2/2010 | Brebner et al. ............... | 716/18 |
| 2002/0176378 A1 | 11/2002 | Hamilton et al. | |
| 2003/0177187 A1 | 9/2003 | Levine et al. | |
| 2008/0002576 A1 | 1/2008 | Bugenhagen et al. | |
| 2008/0002670 A1 | 1/2008 | Bugenhagen et al. | |
| 2008/0002676 A1 | 1/2008 | Wiley et al. | |
| 2008/0002716 A1 | 1/2008 | Wiley et al. | |

(Continued)

OTHER PUBLICATIONS

Kountouris et al., "A Method for the Generation of HDL Code at the RTL level from a High-Level Formal Specification Language," 1997 IEEE, pp. 1095-1098.*

(Continued)

*Primary Examiner*—Leigh Marie Garbowski
(74) *Attorney, Agent, or Firm*—LeRoy D. Maunu

(57) ABSTRACT

A method is provided for generating a hardware description language (HDL) specification of a network packet processor from a textual language specification of the processing of network packets by the processor. The processor includes a look-ahead stage, an operation stage, an insert/remove stage, and an interleave stage. The textual language specification identifies the ports of the processor. The textual language specification includes formats for the type or types of the incoming and outgoing network packets. Each format includes the fields of the type of network packet. The textual language specification includes a procedure for each input port and for each type of incoming network packet received at the input port. Each procedure includes one or more actions for modifying the fields of a type of network packet as a function of state data and/or the fields of the type of network packet.

20 Claims, 5 Drawing Sheets

U.S. PATENT DOCUMENTS

| | | |
|---|---|---|
| 2008/0005156 A1 | 1/2008 | Edwards et al. |
| 2008/0049626 A1 | 2/2008 | Bugenhagen et al. |
| 2008/0049628 A1 | 2/2008 | Bugenhagen |
| 2008/0049630 A1 | 2/2008 | Kozisek et al. |
| 2008/0049769 A1 | 2/2008 | Bugenhagen |
| 2008/0049927 A1 | 2/2008 | Wiley et al. |
| 2008/0052387 A1 | 2/2008 | Heinz et al. |
| 2008/0052393 A1 | 2/2008 | McNaughton et al. |
| 2008/0052394 A1 | 2/2008 | Bugenhagen et al. |
| 2008/0133518 A1 | 6/2008 | Kapoor et al. |
| 2008/0162390 A1 | 7/2008 | Kapoor et al. |

OTHER PUBLICATIONS

Shiro et al., "A Processor Generation Method from Instruction Behavior Description Based on Specification of Pipeline Stages and FUnctional Units," 2007 IEEE, pp. 286-291.*

U.S. Appl. No. 11/799,860 by Keller et al., filed May 3, 2007 by Xilinx, Inc.

U.S. Appl. No. 11/799,953 by James-Roxby et al., filed May 3, 2007 by Xilinx, Inc.

U.S. Appl. No. 11/799,966 by Keller et al., filed May 3, 2007 by Xilinx, Inc.

U.S. Appl. No. 11/799,898 by Keller et al., filed May 3, 2007 by Xilinx, Inc.

U.S. Appl. No. 10/769,330, filed Jan. 30, 2004, James-Roxby et al.

U.S. Appl. No. 11/818,722, filed Jun. 14, 2007, Brebner et al.

U.S. Appl. No. 11/818,788, filed Jun. 14, 2007, Attig et al.

U.S. Appl. No. 11/818,792, filed Jun. 14, 2007, Brebner.

U.S. Appl. No. 11/818,811, filed Jun. 14, 2007, Attig et al.

Attig, Michael et al., "Systemic Characterization of Programmable Packet Processing Pipelines," *Proc. of the 14th Annual IEEE Symposium on Field-Programmable Custom Computing Machines*, Apr. 2006, pp. 195-204, IEEE, Piscataway, New Jersey, USA.

Sun, Hairong et al., "A Performance Model of Partial Packet Discard and Early Packet Discard Schemes in ATM Switches," Mar. 14, 2000, pp. 1540-1553, *Computer Communications*, vol. 24 (2001).

\* cited by examiner

202 — element IPOptionizer {
204 {
    // Ports
    input packetin : Packet;
    output packetout : Packet;
    output memoryreq : MemoryAccess;

206 {
    // Ethernet MAC + LLC + SNAP header
    format header = ( pad : 16,
            source : 48,
            destination : 48,
            length : 16,
            LLC : 24,
            SNAP : 40
        );
    // IP encapsulated in Ethernet packet
    format IPpacket = ( Ethernet : header,
            version : 4,
            hlen : 4,
            TOS : 8,
            length : 16,
            id : 16,
            flags : 3,
            offset : 13,
            TTL : 8,
            protocol : 8,
            checksum : 16,
            source : 32,
            destination : 32,
            payload : *
        );
    // Memory data format – some sort of IP options field
    format optionfield = ( flag : 1,
            class : 2,
            number : 5,
            length : 16,
            data : 104
        );

207 {
    // Global variable (initialization not shown)
    var default : 8;

208 {
    // Packet processing example
    handle IPpacket on packetin {
210     var memorydata : optionfield;
212     set TTL = TTL – 1;
213     set checksum = default;
214     read memorydata from memoryreq [ id ];
216     [ version == 4 ] insert memorydata after destination;
218     forward on packetout;
    }
}

GENERATION OF A SPECIFICATION OF A NETWORK PACKET PROCESSOR

FIELD OF THE INVENTION

The present invention generally relates to processors of network packets, and more particularly to generation of a network packet processor.

BACKGROUND

A network packet processor may input a stream of network packets, manipulate the contents of the network packets, and output another stream of modified network packets. The manipulations may implement a protocol for processing network packets. For example, the network packet processor may implement a protocol layer of a communication protocol, and for a high-level packet received from a higher protocol layer and delivered to a lower protocol layer for eventual transmission on the communication media, the manipulations may encapsulate the high-level packet within a low-level packet of the lower protocol layer.

A protocol designer may develop a specification of the processing of network packets by a network packet processor. A hardware designer, such as an integrated circuit designer, may create a hardware implementation of a network packet processor that complies with the requirements specified by the protocol designer. Thus, development of a network packet processor implemented in hardware may require the specialized knowledge and skills of at least two separate fields of expertise. Because multiple fields of expertise may be required during development of a hardware implementation of a network packet processor, development of a network packet processor may be time consuming and expense.

Rapid development of the protocol or implementation of a network packet processor may improve the timeliness and/or quality of the network packet processor. For example, if a hardware implementation can be generated quickly given a specification of the processing of network packets, deficiencies discovered in an initial implementation may be addressed by modifying the specification and generating an improved implementation. Additional iterations of improvement may be possible if the hardware implementation can be generated quickly from a protocol specification.

The present invention may address one or more of the above issues.

SUMMARY

Various embodiments of the invention provide a method for generating a hardware description language (HDL) specification of a network packet processor. The HDL specification of the network packet processor includes a look-ahead stage, an operation stage, an insert/remove stage, and an interleave stage. The HDL specification of the network packet processor is generated from a textual language specification that specifies the processing of network packets by the network packet processor. The textual language specification identifies the ports of the network packet processor. The ports including one or more input ports for receiving incoming network packets and one or more output port for transmitting outgoing network packets. The textual language specification includes formats for the type or types of the incoming and outgoing network packets. Each format includes the fields of the type of network packet. The textual language specification includes a procedure for each input port and for each type of incoming network packet received at the input port. Each procedure includes one or more actions for modifying one or more fields of a type of network packet as a function of state data stored by the network packet processor and/or one or more fields of the type of network packet.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 2 is a listing of an example textual language specification of a network packet processor in accordance with various embodiments of the invention;

DETAILED DESCRIPTION

Various embodiments of the invention permit a network packet processor to be implemented from a specification of the required processing of network packets by the network packet processor. The implementation of the network packet processor may be a hardware implementation in a programmable logic device (PLD) that may be quickly generated from the specification of the processing protocol of the network packet processor. The generated hardware implementation may have low latency and may efficiently utilize the resources of the PLD.

Figure 1:
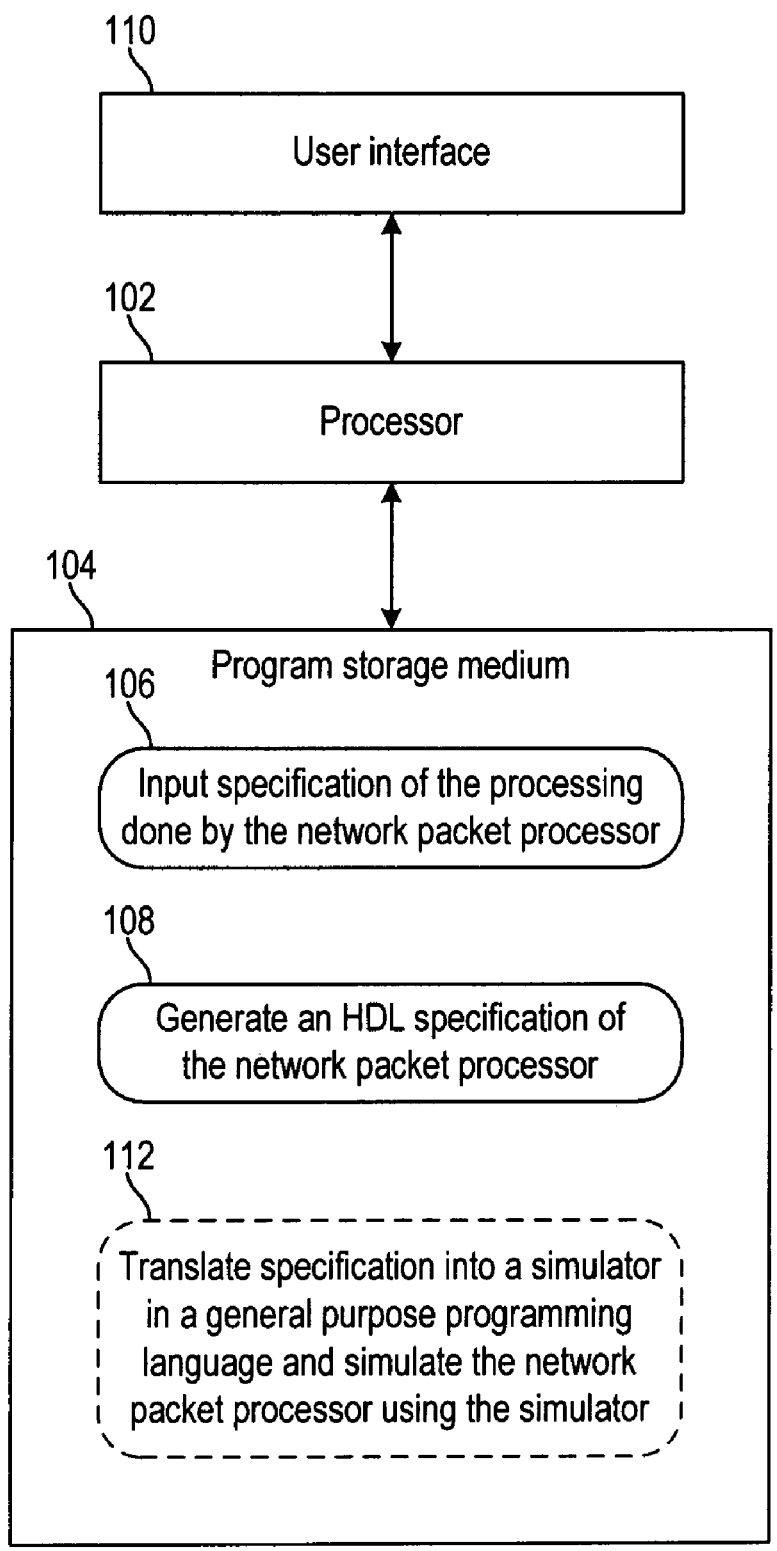
FIG. 1 is a block diagram of a system for generating a hardware description language specification of a network packet processor in accordance with various embodiments of the invention.

FIG. 1 is a block diagram of a system for generating a hardware description language (HDL) specification of a network packet processor in accordance with various embodiments of the invention. A processor 102 reads and executes instructions from a program storage medium 104, and the execution of the instructions causes processor 102 to generate the HDL specification of the network packet processor. Software modules 106 and 108 may include the instructions of the program storage medium 104.

Execution of the instructions of software module 106 may cause processor 102 to input a specification of the processing to be performed by the network packet processor. In one embodiment, the network packet processor may receive network packets and transmit a modification of the received network packets. The specification of the processing by the network packet processor may be a protocol specification of the modifications to be performed by the network packet processor. For example, the network packet processor may implement a protocol layer of a communication protocol, and for a high-level packet received from a higher protocol layer and delivered to a lower protocol layer for eventual transmission on the communication media, the specification may describe the encapsulation of the high-level packet within a low-level packet of the lower protocol layer. The encapsulation specified by the protocol specification may include insertion of a header with a particular format before the beginning of the high-level packet. The header may be generated from information in the incoming high-level packet and from information that is stored within the network packet processor.

Execution of the instructions of software module 106 may cause processor 102 to input the specification from the user interface 110. In one embodiment, the user interface 110 may permit directly inputting a textual language specification of the processing expected from the network packet processor. In another embodiment, the textual language specification may be input from a data file stored in program storage medium 104 or another storage medium of the system.

Execution of the instructions of software module 108 may cause processor 102 to generate an HDL specification of the network packet processor from the textual language specification input by processor 102 during execution of the instructions of software module 106. The network packet processor generated using software module 108 may implement the manipulations of the textual language specification.

Execution of the instructions of the optional software module 112 may cause processor 102 to translate the specification of the network packet processor into a simulator in a general purpose programming language and to simulate the network packet processor using the simulator.

FIG. 2 is a listing of an example textual language specification of a network packet processor in accordance with various embodiments of the invention. Various embodiments of the invention may translate the example textual language specification into a network packet processor that processes network packets as specified. The specification includes a declaration 202 of the name the network packet processor, a declaration 204 of the ports of the network packet processor, a declaration 206 of formats of types of network packets and other data structures, a declaration 207 of a global variable, and a specification 208 of a handler procedure for processing the network packets by the network packet processor.

As specified in ports declaration 204, the network packet processor has an input port with identifier "packetin" for receiving network packets, an output port with identifier "packetout" for transmitting network packets, and a memory port with identifier "memoryreq" for accessing an external memory. As specified in the handler specification 208, the network packets received at the input port are modified and the modified network packets are transmitted from the output port. Certain of the received network packets are modified using data that is read from an external memory using the memory port. It will be appreciated that a network packet may also be modified using state data that is stored within the network packet processor.

The handler specification 208 specifies processing of network packets that have type "IPpacket" and are received at the input port "packetin." The handler specification 208 includes a declaration 210 of a local variable and specifications of five actions, including set action 212, set action 213, memory read action 214, insert action 216, and forwarding action 218. For each network packet of type "Ippacket" that is received at the input port "packetin," set action 212 decrements the "TTL" field of the network packet. Set action 213 sets the value of the "checksum" field to a value of the global variable of declaration 207. Memory read action 214 reads a memory at the address given by the "id" field of the network packet. The insert action 216 includes a guard condition within the square brackets that enables the insert action 216 when the "version" field of the network packet has a value of 4, and otherwise the insert action 216 is disabled. If the insert action 216 is enabled by the guard condition, the insert action 216 inserts data from the memory read action 214 after the "destination" field of the network packet. Forwarding action 218 transmits the modified network packet at the output port "packetout."

The value of the global variable of declaration 207 could be updated by a handler procedure during the processing of one network packet, and the updated value could be used during the processing of another network packet by the handler procedure. Thus, the global variable of declaration 207 may provide state data that is preserved between network packets. In contrast, the local variable of declaration 210 may be temporary data that should be reinitialized for each network packet that is processed.

The textual language for specifying the processing of a network packet handler may closely correspond with the techniques that a designer uses to specify a communication protocol. A designer of communication protocol may develop the textual language specification without having the specialized knowledge required to develop an integrated circuit, and various embodiments of the invention may translate the textual language specification of a communication protocol into an efficient implementation of the communication protocol in a network packet processor. Thus, various embodiments of the invention permit a designer of a communication protocol to develop an integrated circuit for efficiently implementing the communication protocol even though the designer does not have the skills for designing an integrated circuit.

Figure 3:
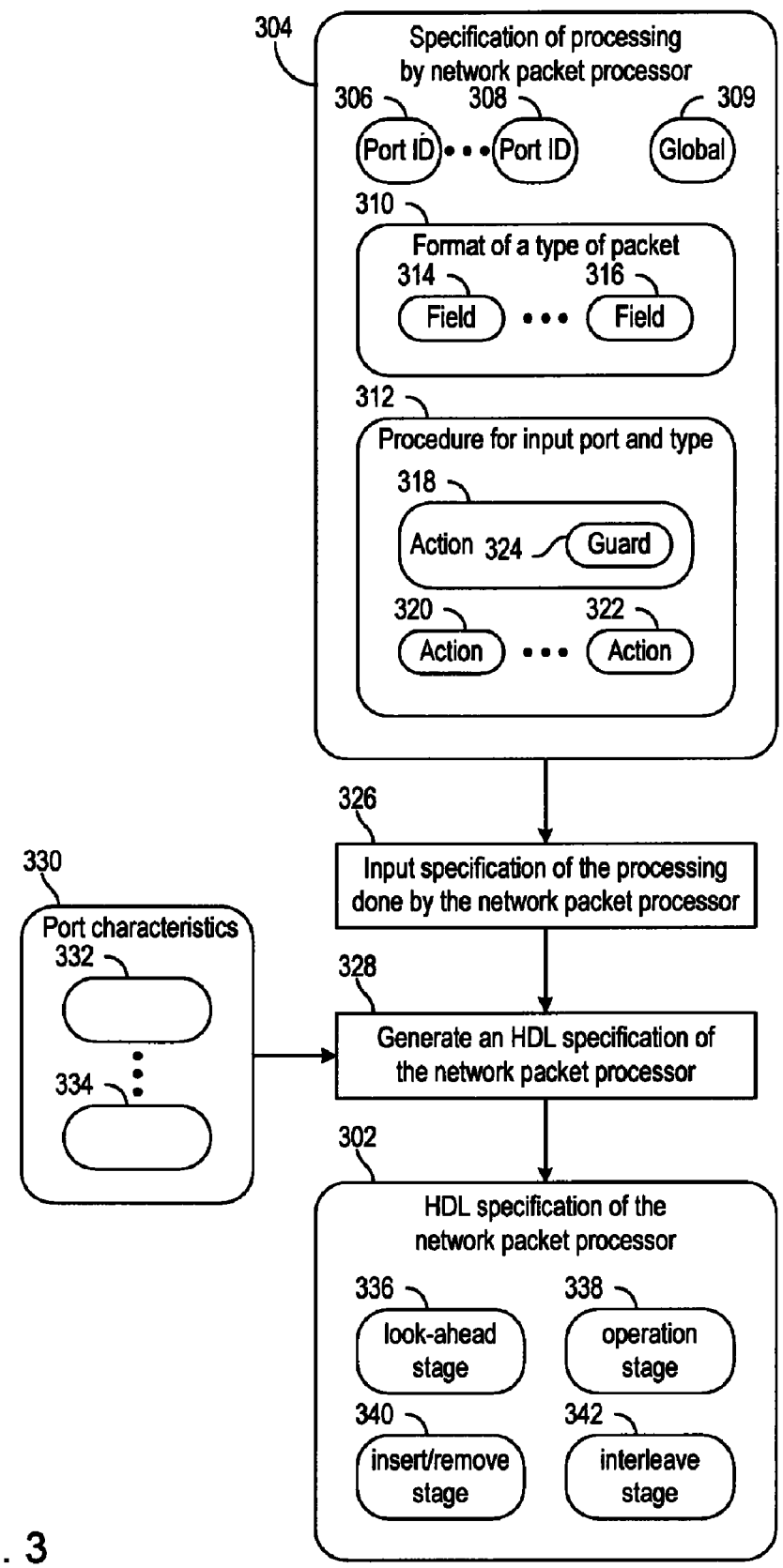
FIG. 3 is a data flow diagram of a process of generating a hardware description language specification of a network packet processor in accordance with various embodiments of the invention.

FIG. 3 is a data flow diagram of a process of generating a hardware description language (HDL) specification 302 of a network packet processor in accordance with various embodiments of the invention. The HDL specification 302 may be generated from a textual language specification 304 of the processing performed by the network packet processor.

The textual language specification 304 of the network packet processor may include port identifiers 306 and 308, global variables 309, a format 310 or formats for one or more types of network packets and possibly other data structures, and a procedure 312 for each input port and each type of network packet that is expected at the input port of the network packet processor. The port identifiers 306 and 308 may include respective identifiers for the input, output, and any memory ports of the network packet processor. The global variables 309 may provide state data that is preserved between network packets. A format 310 includes the fields 314 and 316 of a type of network packet, and a field 314 or 316 may be declared in the format 310 as having a specified name and a specified size, such as a number of data bits of the field. The fields 314 and 316 may be specified in format 310 in an order corresponding to an order of the network packet manager receiving or transmitting the fields in the type of network packets.

A procedure 312 may include actions 318, 320, and 322 for manipulating network packets of a particular type that are received at a particular input port. Examples for actions 318, 320, and 322 include a set action for setting a value of a field 314 as a function of global variables 309 and/or fields 314 and/or 316, an insert action for data insertion at a field 314 as a function of global variables 309 and/or fields 314 and/or 316, a remove action for data removal at field 314 as a function of global variables 309 and/or fields 314 and/or 316, an update action for updating one of the global variables 309 as a function of the global variables 309 and/or fields 314 and/or 316, a forward action for transmitting modified network packets from an output port of the network packet processor, a memory read action for reading a value from a memory, and a memory write action for writing a value to the memory.

An action 318 may include a guard condition 324 for enabling and disabling the action 318, with the action 318 performed in response to the guard condition 324 being satisfied and the action 318 being bypassed in response to the guard condition 324 not being satisfied. Another action 320 might not include a guard condition and the action 320 may always be performed on each network packet that is processed using procedure 312. Examples for guard condition 324 include a check of a value of a field 314 of a type of the network packets, a comparison between two fields 314 and 316 of a type of the network packets, and a comparison between a field 314 and one of the global variables 309.

At step 326, the specification 304, which specifies the processing performed by the network packet processor, is input. At step 328, the HDL specification 302 of the network packet processor is generated. To generate the HDL specification 302 of the network packet processor, a specification 330 may be input that specifies the characteristics 332 and 334 of the ports having identifiers 306 and 308. Example characteristics include a width for each of the ports and a signaling protocol for each of the ports.

The generated HDL specification 302 may include a look-ahead stage 336, an operation stage 338, an insert/remove stage 340, and an interleave stage 342. The look-ahead stage 336 may synchronize among the fields 314 and 316 that are accessed by the actions 318, 320, and 322 of the procedure 312. The look-ahead stage 336 may make certain of fields 314 and 316 concurrently available for processing according to the actions 318, 320, and 322 of the procedure 312. The operation stage 338 may implement the actions 318, 320, and 322 that are not insert or remove actions. For each set action, the operation stage may set one of fields 314 and 316 according to the set action. The operation stage 338 may evaluate a guard condition 324 for an action 318, and bypass performing the action 318 when the guard condition 324 is not satisfied. The insert/remove stage 340 may perform data insertion and/or data removal at one or more of fields 314 and 316 according to the actions 318, 320, and 322 that are insert or remove actions. The data insertion or data removal may be bypassed for an insert or remove action with a guard condition that is not satisfied. The interleave stage 342 may ensure that the modified network packet follows rules for interleaving network packets.

A sequence of network packets may be received at an input port of the network packet processor, with each network packet including a series of data chunks. The data chunks for the network packets may be serially received in an interleaved manner. For example, network packet A may include data chunks A[0], A[1], and A[2], and network packet B may include data chunks B[0], B[1], and B[2], which are serially received at an input port of the network packet processor in the interleaved order A[0], B[0], A[1], B[1], A[2], B[2]. For a network packet processor with an insert/remove stage 340 that modifies network packet A by removing a portion of data chunk A[1], to output full data chunks the network packet processor may need to fill in modified data chunk A[1] with data from subsequent chunks of network packet A. Similarly, for a network packet processor with an insert/remove stage 340 that modifies network packet B by inserting data into chunk B[1], to output proper data chunks the network packet processor may need to move data from modified data chunk B[1] to subsequent chunks of network packet B.

In one embodiment, a data chunk is the data width of the input and output ports of a network packet processor. The interleaving rules may permit interleaving of network packets between each data transfer across the width of a port of the network packet processor. After a data insertion or data removal with a size that is not a multiple of the data chunk, the interleave stage 342 may pad the modified network packet with enough null data to make a full data chunk at the end of the network packet. It will be appreciated that the interleave stage 342 may be useful for generating complete data chunks across the full width of the input and output ports even though data chunks for different network packets are never interleaved.

In another embodiment, a data chunk is a burst of a fixed or variable number of data transfers across the width of a port of the network packet processor, and interleaving of network packets may occur between the bursts of the data chunks. For a variable number of data transfers, the interleaving rules may specify an upper limit on the number of data transfers within a burst. After a data insertion that increases the size of a network packet beyond the fixed number of data transfers allowed for a burst or beyond the upper limit on a variable number of data transfers for a burst, the interleave stage 342 may divide the modified network packet into multiple bursts to satisfy the interleaving rules.

It will be appreciated that the port characteristics 330 may specify both the width of the ports and the burst lengths for the ports. In addition, port characteristics 330 may specify whether network packets are received in an interleaved manner by the network packet processor.

Figure 4:
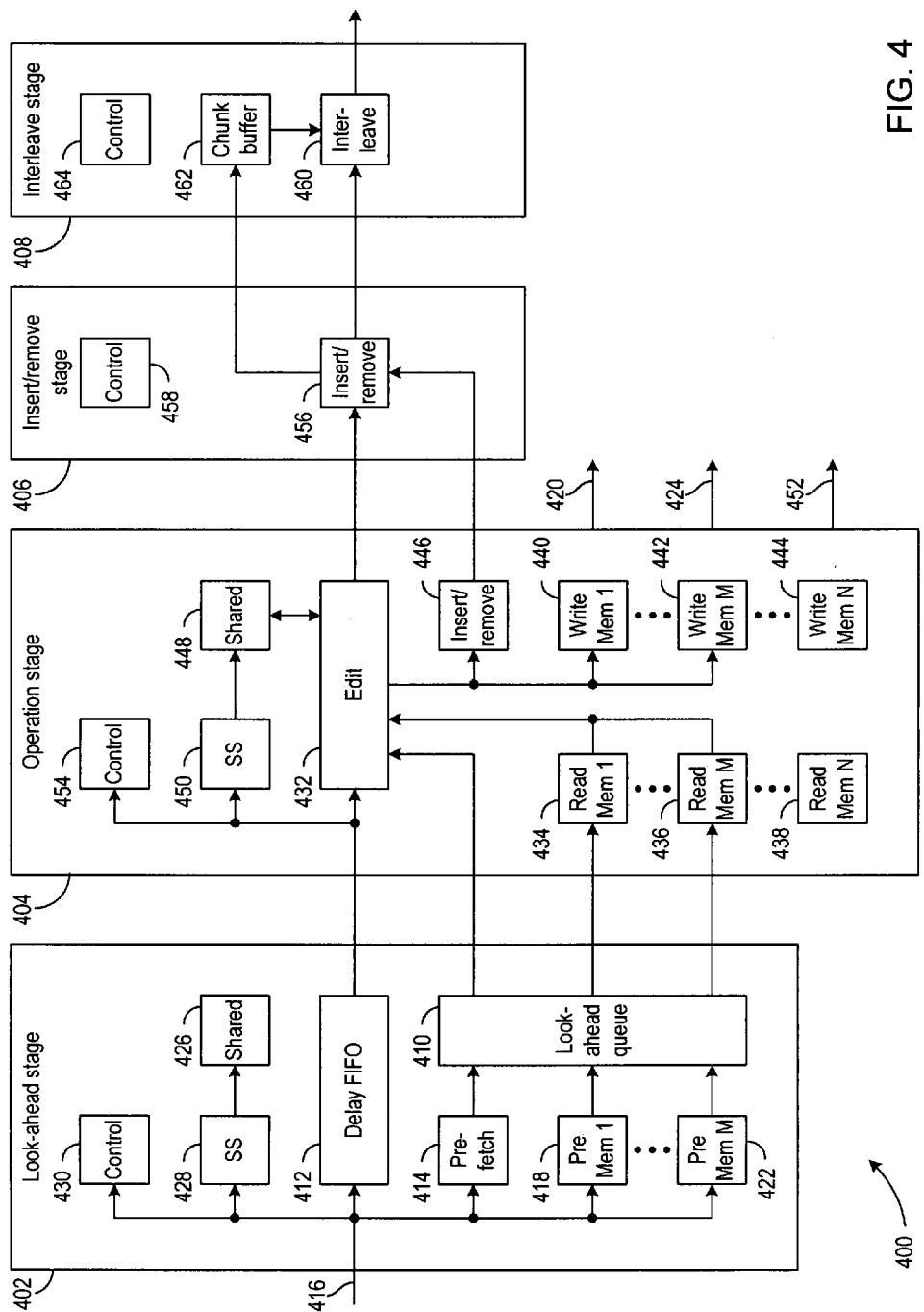
FIG. 4 is a block diagram of a network packet processor that is generated in accordance with various embodiments of the invention.

FIG. 4 is a block diagram of a network packet processor that is generated in accordance with various embodiments of the invention. The network packet processor is a pipeline 400 that includes a look-ahead stage 402, an operation stage 404, an insert/remove stage 406, and an interleave stage 408. Stages 402, 404, 406, and 408 of the pipeline 400 are configured by a textual language specification of the processing by the network packet processor.

The textual language specification may specify one or more actions for modifying the fields of a network packet as a function of the fields of the network packet and global variables corresponding to stored state 428 and 450 within the network packet processor. For example, a set action may modify a field of a network packet as a function of another field of this network packet, and these two fields may be received at different times during a serial reception of the data chunks of the network packet. Each modification of a field may be completed upon receiving the field providing the field is modified as a function of stored state and fields that are already available from the network packet. In contrast, a modification of a field might not be possible upon receiving the field when the field is modified as a function of a field or fields that are later received. The look-ahead stage 402 may effectively advance the availability of each field that is used to modify an earlier-received field, such that the operation stage 404 may perform the modification for each set action upon receiving the data chunk that includes the field that is modified by the set action.

To effectively advance the availability of certain fields, the look-ahead stage 402 may promptly provide these fields from look-ahead queue 410, while the look-ahead stage 402 may provide other fields with delayed availability from delay FIFO 412. Various fields may be concurrently available from the look-ahead queue 410 and the delay FIFO 412. The delay FIFO 412 may have a depth equaling the maximum amount of relative advancement that is needed. If no fields need advanced availability for a particular textual language specification, the look-ahead stage 402 may be omitted from the pipeline 400.

Certain fields of a network packet that need advanced availability may be selected by pre-fetch block 414 and stored in look-ahead queue 410 during reception of the network packet at the input port on line 416. Because these fields are promptly made available to the operation stage 404 from look-ahead queue 410, these fields are effectively advanced relative to fields that are later made available to the operation stage 404 from delay FIFO 412.

The network packet processor may access a memory or memories during the processing of a network packet. For example, an address for a memory read action may be formed from a field of the network packet and a set action may modify the same field of the network packet using the value read from the memory at the address. The set action may include a guard condition that enables modifying the same field with a modification value, and either the guard condition or the modification value of the set action may be dependent on the value read from the memory. If a delay interval is required for reading the memory, the modification of the field might not be immediately possible upon receiving the field. The delay interval may be a latency of the memory and/or a time interval needed to form wide data by reading narrow data multiple times from the memory. The look-ahead stage 402 may also effectively advance the availability of certain fields needed for reading from one or more memories.

For the memory read actions that need advanced availability and that access the memory connected to the memory port on line 420, memory pre-fetch block 418 may capture any fields needed to generate any addresses for these memory read actions. Memory pre-fetch block 418 may also capture the fields needed to generate any guard conditions for these memory read actions.

Similarly, memory pre-fetch block 422 may capture the fields needed to determine any addresses and any guard conditions for the memory read actions that need advanced availability for the memory connected to the memory port on line 424. When advanced availability is needed for a value read from a memory for a memory read action, the amount of advanced availability may contribute to determining the depth of the delay FIFO 412.

The stored state block 428 may include state data for certain of the global variables of the specification of the processing of the network packet processor. Some of the global variables may be used in actions needing advanced availability, and the stored state block 428 of look-ahead stage 402 may store the state data for these global variables, while the stored state block 450 of operation stage 404 may store the state data for the remaining global variables.

Certain fields of a network packet may be referenced by multiple actions of the textual language description. For example, a specific field may be referenced by two set actions, which modify respective fields that are in different data chunks and are consequently received by the pipeline 400 at different times. Thus, certain fields may need to be available at multiple time steps and to eliminate duplicated storage these fields may be stored in a register within shared block 426. Shared block 426 may make these fields and/or certain temporary variables available to one or more of blocks 414, 418, and 422.

The control block 430 may control the sampling of certain fields of a network packet by the blocks 428, 426, 414, 418, and 422 as specified by the certain actions of the textual language specification.

The operation stage 404 may implement the actions of the textual language specification excluding the insert and remove actions. The edit block 432 may perform the set actions on each network packet as the data chunks of the network packet are received from the delay FIFO 412 of the look-ahead stage 402. The edit block 432 may perform the set actions using fields with advanced availability from the look-ahead queue 410 of the look-ahead stage 402 and memory read results from the memory read blocks 434, 436, and 438.

The edit block 432 may determine information that is provided to the memory write blocks 440, 442, and 444, and to the insert/remove block 446. Certain fields and/or temporary variables may be shared between the shared block 448 and the blocks 432, 434, 436, 438, 440, 442, 444, and 446. The edit block 432 may update the values of any temporary variables in the shared block 448.

Because the memory connected to the memory port on line 420 may have a memory read action that produces a read result needing advanced availability, the memory read block 434 may receive certain fields with advanced availability from the look-ahead queue 410. These fields may be used to determine any address or any guard conditions for this memory read action. Any address or guard condition for this memory read action may also be determined from other fields that do not need advanced availability and state data from stored state 450.

The memory read block 434 may implement all of the memory read actions that target the memory connected to the memory port on line 420. Depending upon whether or not the read result needs advanced availability for a memory read action accessing the memory port on line 420, the memory read block 434 may generate an address or guard condition for the memory read action using information from the look-ahead queue 410, or the memory read block 434 may generate an address or guard condition using information from the shared block 448.

The memory read block 438 may implement all of the memory read actions that target the memory connected to the memory port on line 452, and none of these memory read actions may need advanced availability of the read result. Because the memory read block 438 does not need to obtain advanced information from the look-ahead queue 410, no connection is shown between the look-ahead queue 410 and the memory read block 438. For example, the memory connected to the memory port on line 452 may be a FIFO or configuration register that does not require an address and hence advanced availability is not needed for the result read from the memory because the memory may be read at any time.

It will be appreciated that the actual number of memory read blocks 434, 436, and 438 for a particular textual language specification may depend on the number of memories accessed by the memory read actions of the textual language specification. In addition, the connections between the look-ahead queue 410 and the memory read blocks 434, 436, and 438 may depend on whether advanced availability is needed for the memory reach actions of the textual language specification.

For each memory write action of the textual language specification, the edit block 432 may provide the write value along with an optional address and optional guard condition to the write memory blocks 440, 442, and 444. Write memory blocks 440, 442, and 444 may implement the memory write actions that write to the respective memories connected to memory ports on lines 420, 424, and 452.

For each insert action and each remove action of the textual language specification, the insert/remove block 446 may determine the position of the data insertion or data removal and the amount of data to be inserted or removed. The insert/remove block 446 may also determine the value of any guard condition for enabling and disabling the data insertion or data removal. For data insertion, the insert/remove block 446 may determine the insertion data. The insert/remove block 446 may obtain information for determining the position and amount of the data insertion or data removal and the insertion data from the edit block 432 and/or the shared block 448.

The control block 454 may manage the operation of the blocks 432, 434, 436, 438, 440, 442, 444, 446, and 448 of the operation stage 404.

The insert/remove stage 406 implements the insert actions and remove actions of the textual language specification. The insert/remove stage may be omitted from the pipeline 400 for a specific textual language specification that does not include any insert or remove actions. The insertion/removal block 456 performs the data insertion of any insert actions and the data removal of any remove actions according to information received from the insert/remove block 446 of the operation stage 404. The control block 458 controls the operation of the insertion/removal block 456. The insertion/removal block 456 may serially receive potentially modified data chunks of a network packet from the edit block 432 of the operation stage 404. While a data insertion or data removal is not in progress, the data chunks received by the insertion/removal block 456 are the data chunks output by the insertion/removal block 456.

Each insert action and each remove action of a textual language specification may optionally include a guard condition. An action that does not include a guard condition is always enabled, and an action with a guard condition is enabled when the guard condition is determined to have an enabling value.

For a remove action that is enabled, upon receiving the data chunk of the network packet that includes the position of the data removal, the insertion/removal block 456 may output a partial data chunk that includes the portion of the data chunk before the position of the data removal. The insertion/removal block 456 may suspend outputting data chunks until the specified amount of data is removed and the insertion/removal block 456 may subsequently resume outputting data chunks of the network packet. The first data chunk output on resuming output may be a partial data chunk. In one embodiment, multiples of a byte may be inserted and removed and the insertion/removal block 456 outputs a number of bytes in parallel for each word of the burst of a data chunk. Each byte that is output may have a corresponding data valid signal to indicate whether the byte is included in a full or partial data chunk.

For an insert action that is enabled, upon receiving the data chunk of the network packet that includes the position of the data insertion, the insertion/removal block 456 may output a full data chunk and then switch to outputting the insertion data. The final data chunk of the insertion data may be a partial data chunk and the insertion/removal block 456 may subsequently resume outputting full data chunks of the network packet. During the data insertion, the insert/remove stage 406 may stall the operation stage 404 and the look-ahead stage 402 to prevent data loss.

The interleave stage 408 may ensure that the modified network packet follows rules for interleaving network packets. The interleave stage 408 may eliminate the gaps in the valid data from any partial data chunks created by the insert/remove stage 406. The interleave stage 408 may divide a network packet into multiple bursts to satisfy the interleaving rules. The interleave stage 408 may be omitted for a textual language specification that only inserts and removes data that is always a multiple of the size of the data chunk. The interleave stage 408 may be eliminated along with the insert/remove stage 406 for a textual language specification that does not include any insert or remove actions.

The interleave block 460 may generate each data chunk that is output from the pipeline 400 by selecting from either the chunk buffer 462 or the insertion/removal block 456 of the insert/remove stage 406. The chunk buffer 462 may contain a portion of the preceding network packet. The control block 464 may be a state machine that controls the operation of the chunk buffer 462 and the interleave block 460.

Figure 5:
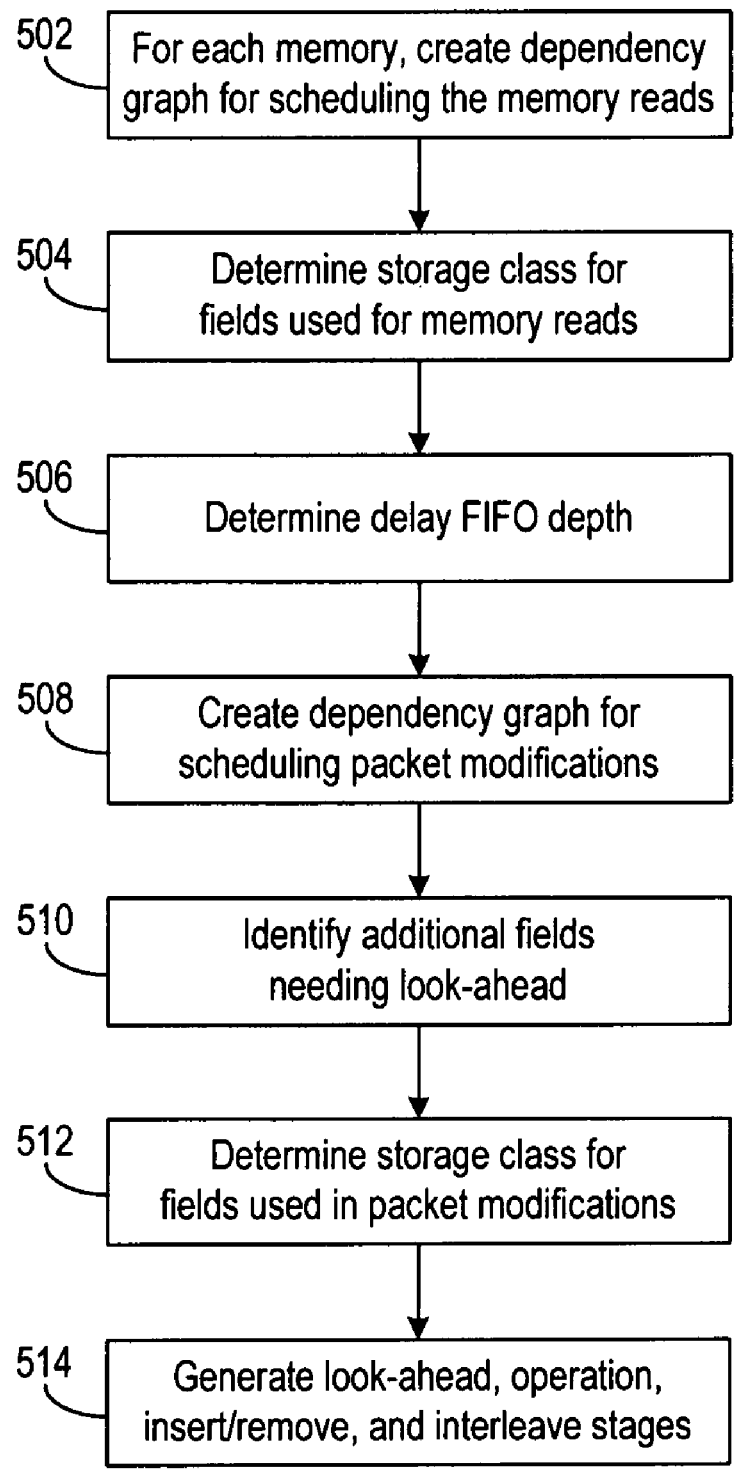
FIG. 5 is a flow diagram of a process for generating a pipeline for processing network packets in accordance with various embodiments of the invention.

FIG. 5 is a flow diagram of a process for generating a pipeline for processing network packets in accordance with various embodiments of the invention. The processing of network packets by the pipeline may be specified in a textual language specification, and this specification may be analyzed to generate a specification of the pipeline in a hardware description language. Synthesis tools may generate a hardware implementation of the pipeline from the generated specification. For example, ISE Foundation available from Xilinx, Inc. may be used to create an implementation of the pipeline in a programmable logic device.

At step 502, the specification of the processing of the pipeline may be analyzed to determine the number of memories accessed by the pipeline. For each memory, a dependency graph may be created for scheduling the memory reads that access the memory. Each memory read may require an optional address and an optional guard condition, and each memory read may provide a result value. The addresses and guard conditions may be calculated from certain fields of a network packet and a node may be added to the dependency graph for each of these fields and for each read result from the memory. These nodes are marked with an availability time relative to a start of the network packet. An availability time for a field may be readily calculated from a position of the field within the network packet and a data width of an input of the pipeline for receiving the network packet. For a read result that is dependent on a set of fields for calculating the address and guard condition, the read result may be marked with an availability time that is the sum of the latency for the memory read and the latest availability time of the fields in the set. It will be appreciated that for a memory read without an address and without a guard condition, such as a read from a configuration memory, the result of the memory read may be marked as available at time zero corresponding to the beginning of the network packet.

The optional address and optional guard condition of each memory read may also be dependent on a local variable that is further dependent on certain fields of a network packet, global variables, or the results of other memory reads. Additional nodes may similarly be added and marked in the dependency graph for these indirect dependencies.

Once each dependency graph is resolved to assign an availability time to each node in the graph, each memory read is scheduled to provide the read result at the availability time of the read result. For a memory having a non-zero read latency, the memory read may be issued in advance to provide the read result at the required time. Because a result from a memory read may be used to determine the address or guard condition of another memory read, perhaps indirectly via a local variable, iteration may be required to completely resolve the dependency graph.

At step 504, a storage class may be determined for each field used to generate the address and guard conditions of the memory reads. For a field with an availability time that matches the issue time of every memory read that uses the field, the storage class may be a wire class indicating a direct connection. For a field with an availability time in advance of the issue time of every memory read that used the field, the storage class may be a register class. Otherwise, the storage class may be a register with a bypass path.

At step 506, a depth of the delay FIFO of the look-ahead stage may be determined. The delay FIFO may receive a stream of network packets from an input of the pipeline and the delay FIFO may output the stream of network packets after a fixed time delay, which is set by the depth of the delay FIFO.

In one embodiment, the depth may be selected to have the delay FIFO output the start of a network packet at a time when the results are available for all of the memory reads. Thus, the depth of the delay FIFO may equal the largest value of the availability times of the read results from the dependency graph or graphs. The delay FIFO may be regarded as effectively advancing the memory read results to ensure availability at time zero when the start of the network packet is output from the delay FIFO.

In another embodiment, a usage time and a difference between the usage time and the availability time is determined for each memory read result and the depth of the delay FIFO may equal the largest difference for the memory read results that have a usage time before the availability time.

At step 508, a dependency graph may be created for scheduling the modifications of a network packet. A network packet may be modified by changing a field of the network packet, inserting data into a network packet, or removing data from a network packet. Various fields of the network packet may be used to determine, for example, a modification value for changing a field of a network packet or a packet-dependent length of data to be inserted or removed at a field of the network packet. Certain fields of the network packet may also be used to determine a guard condition for enabling or disabling a field modification or a data insertion or deletion.

A node may be added to the dependency graph for each of these fields and these nodes may be marked with an availability time of the receiving the field relative to a start of the network packet. Additional nodes may be added for the calculated modifications and these additional nodes may be marked with corresponding availability times. From the dependency graph, the modifications of the network packet may be scheduled at the availability times determined for the guard conditions of the modifications, the modification values, the variable locations of data insertion or removal, the variable lengths of data insertion or removal, and the insertion data values.

The FIFO depth selected at step 506 may provide inadequate advancement of some of the fields used for packet modifications. At step 510, these additional fields needing look-ahead may be identified, and the FIFO depth determined at step 506 may be increased and consequently the storage classes determined at step 504 may be adjusted. At step 512, the storage classes are determined for the fields used for packet modifications.

At step 514, a specification of the look-ahead, operation, insert/remove, and interleave stages may be generated in a hardware description language.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A processor-based method for generating a hardware description language (HDL) specification of a network packet processor, comprising:
   inputting a textual language specification of processing by the network packet processor of network packets; and
   generating and storing the HDL specification of the network packet processor in response to the textual language specification, the network packet processor including a look-ahead stage, an operation stage, an insert/remove stage, and an interleave stage, wherein the textual language specification includes:
   a respective identifier of a plurality of ports of the network packet processor, the ports including at least one input port for receiving a first plurality of network packets and at least one output port for transmitting a second plurality of network packets;
   a respective format for each of at least one type of the first and second pluralities of network packets, the respective format for the type including a format of a plurality of fields of the type; and
   a respective procedure for each of the at least one input port and for each type of the first plurality of network packets received at the input port, the respective procedure for processing each network packet of the type that is received at the input port, the respective procedure including at least one action for modifying a first one of the fields of the type as a function of at least one of state data stored by the network packet processor and at least a second one of the fields of the type.

2. The processor-based method of claim 1, wherein the generating of the HDL specification includes generating the HDL specification of the network packet processor in response to the textual language specification that includes the respective procedure that includes at least one action for updating the state data as a function of at least one of the state data and at least one of the fields of the type of network packets for the respective procedure.

3. The processor-based method of claim 1, wherein an action of the respective procedure for an input port and a type includes a guard condition for enabling and disabling the action in response to at least one of the state data and at least the second field of the type.

4. The processor-based method of claim 3, wherein the at least one input port is one input for receiving the first plurality of network packets and the at least one output port is one output port for transmitting the second plurality of network packets.

5. The processor-based method of claim 3, wherein each of the at least one action of the respective procedure for an input port and a type is one of a set action for setting a value of the first field of the type, an insert action for data insertion at the first field of the type, or a remove action for data removal at the first field of the type.

6. The processor-based method of claim 5, wherein the respective procedure for the input port and the type includes at least one additional action, each being one of an update action for setting a value of the state data, a forward action for transmitting the second plurality of network packets from the at least one output port, a memory read action for reading a value from a memory of the network packet processor, or a memory write action for writing a value to the memory of the network packet processor.

7. The processor-based method of claim 3, wherein the action is enabled only in response to the second field of the guard condition equaling one of a set of values.

8. The processor-based method of claim 3, wherein the generating of the HDL specification of the network packet processor in response to the textual language specification includes, for the respective procedure for an input port and a type, generating an HDL specification of the look-ahead stage that synchronizes amongst the first and at least the second fields for each action of the respective procedure for the input port and the type.

9. The processor-based method of claim 8, wherein the generating of the HDL specification of the network packet processor in response to the textual language specification includes generating an HDL specification of the operation stage that sets the first field as a function of at least one of the state data and at least the second field for each of the at least one action that is a set action of the respective procedure for the input port and the type.

10. The processor-based method of claim 9, wherein the generating of the HDL specification of the operation stage includes generating the HDL specification of the operation stage that sets the first field in correspondence with at least one equation for the set action in response to the set action not including a guard condition for enabling and disabling the set action, bypasses setting of the first field for the set action in response to the set action including the guard condition that disables the set action, and sets the first field in correspondence with at least one equation for the set action in response to the set action including the guard condition that enables the set action.

11. The processor-based method of claim 9, wherein the generating of the HDL specification of the network packet processor in response to the textual language specification includes generating an HDL specification of the insert/remove stage that performs data insertion at a third one of the fields for the network packet for each of the at least one action that is an insert action of the respective procedure for the input port and the type, and performs data removal at a fourth one of the fields for the network packet for each of the at least one action that is an removal action of the respective procedure for the input port and the type.

12. The processor-based method of claim 11, wherein the generating of the HDL specification of the insert/remove stage includes generating the HDL specification of the insert/remove stage that performs data insertion at the third field in correspondence with the insert action in response to the insert action not including a guard condition for enabling and disabling the insert action, bypasses performing data insertion for the insert action in response to the insert action including the guard condition that disables the insert action, and performs data insertion at the third field in correspondence with the insert action in response to the insert action including the guard condition that enables the insert action.

13. The processor-based method of claim 11, wherein the generating of the HDL specification of the insert/remove stage includes generating the HDL specification of the insert/remove stage that performs data removal at the fourth field in correspondence with the removal action in response to the removal action not including a guard condition for enabling and disabling the removal action, bypasses performing data removal for the removal action in response to the removal action including the guard condition that disables the removal action, and performs data removal at the third field in correspondence with the removal action in response to the removal action including the guard condition that enables the removal action.

14. The processor-based method of claim 11, wherein the generating of the HDL specification of the network packet processor in response to the textual language specification includes generating an HDL specification of the interleave stage that ensures that the second plurality of network packets follows at least one rule for interleaving network packets.

15. The processor-based method of claim 1, further comprising inputting a specification of a width for each port of the network packet processor, wherein for each of the first plurality of network packets that is received at each of the at least one input port, a plurality of data words of the network packet are serially received at the input port with each of the data words having the width specified for the input port.

16. The processor-based method of claim 15, wherein the respective procedure in the textual language specification for the type of the network packet received at the input port includes an action for modifying the first field of the type of the network packet as a function of the second field of the type of the network packet, and the generating of the HDL specification of the network packet processor in response to the textual language specification includes generating an HDL specification of the look-ahead stage that provides a delay that is determined from a time of serially receiving the second field in the data words of the network packet relative to a beginning of serially receiving the network packet.

17. The processor-based method of claim 16, wherein the generating of the HDL specification of the look-ahead stage includes generating the HDL specification of the look-ahead stage that provides the delay that is the time of serially receiving the second field in the data words of the network packet relative to the beginning of serially receiving the network packet.

18. The processor-based method of claim 16, wherein the generating of the HDL specification of the look-ahead stage includes generating the HDL specification of the look-ahead stage that provides the delay that is a difference between the time of serially receiving the second field in the data words of the network packet and a time of serially receiving the first field in the data words of the network packet.

19. A program storage medium, comprising:
  a processor-readable device configured with instructions for generating a hardware description language (HDL) specification of a network packet processor, wherein execution of the instructions by one or more processors causes the one or more processors to perform operations including,
  inputting a textual language specification of processing by the network packet processor of network packets; and
  generating and storing the HDL specification of the network packet processor in response to the textual language specification, the network packet processor including a look-ahead stage, an operation stage, an insert/remove stage, and an interleave stage, wherein the textual language specification includes:
  a respective identifier of a plurality of ports of the network packet processor, the ports including at least one input port for receiving a first plurality of network packets and at least one output port for transmitting a second plurality of network packets;
  a respective format for each of at least one type of the first and second pluralities of network packets, the respective format for the type including a format of a plurality of fields of the type; and
  a respective procedure for each of the at least one input port and for each type of the first plurality of network packets received at the input port, the respective procedure for processing each network packet of the type that is received at the input port, the respective procedure including at least one action for modifying a first one of the fields of the type as a function of at least one of state data stored by the network packet processor and at least a second one of the fields of the type.

20. A system for generating a hardware description language (HDL) specification of a network packet processor, comprising:

means for inputting a textual language specification of processing by the network packet processor of network packets; and means for generating and storing the HDL specification of the network packet processor in response to the textual language specification, the network packet processor including a look-ahead stage, an operation stage, an insert/remove stage, and an interleave stage, wherein the textual language specification includes:

a respective identifier of a plurality of ports of the network packet processor, the ports including at least one input port for receiving a first plurality of network packets and at least one output port for transmitting a second plurality of network packets;

a respective format for each of at least one type of the first and second pluralities of network packets, the respective format for the type including a format of a plurality of fields of the type; and a respective procedure for each of the at least one input port and for each type of the first plurality of network packets received at the input port, the respective procedure for processing each network packet of the type that is received at the input port, the respective procedure including at least one action for modifying a first one of the fields of the type as a function of at least one of state data stored by the network packet processor and at least a second one of the fields of the type.

* * * * *